(12) United States Patent
Jeong et al.

(10) Patent No.: US 8,748,884 B2
(45) Date of Patent: Jun. 10, 2014

(54) VARIABLE RESISTANCE MEMORY DEVICES HAVING REDUCED RESET CURRENT

(75) Inventors: Ji-Hyun Jeong, Seoul (KR); JaeHee Oh, Seongnam-si (KR); Heung Jin Joo, Suwon-si (KR); Sung-Ho Eun, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 508 days.

(21) Appl. No.: 13/081,168

(22) Filed: Apr. 6, 2011

(65) Prior Publication Data

US 2011/0248235 A1 Oct. 13, 2011

(30) Foreign Application Priority Data

Apr. 8, 2010 (KR) .................. 10-2010-0032381

(51) Int. Cl.
*H01L 29/12* (2006.01)
(52) U.S. Cl.
USPC .............................. 257/43; 257/44
(58) Field of Classification Search
USPC ............... 257/43, 44, 295, E45.002
See application file for complete search history.

(56) References Cited

U.S. PATENT DOCUMENTS 7,807,995 B2 * 10/2010 Mikawa et al. ............ 257/43

FOREIGN PATENT DOCUMENTS

| KR | 1020050040463 | 5/2005 |
| KR | 1020070094194 | 9/2007 |
| KR | 1020080111206 | 12/2008 |
| KR | 1020090070284 | 7/2009 |

* cited by examiner

*Primary Examiner* — Long Pham
*Assistant Examiner* — Steven Rao
(74) *Attorney, Agent, or Firm* — Myers Bigel Sibley & Sajovec, PA

(57) ABSTRACT

A nonvolatile memory device includes a substrate and a first insulating layer on the substrate. The first insulating layer includes a first opening therein. A lower electrode is provided in the first opening and protrudes from a surface of the first insulating layer outside the first opening. An electrode passivation pattern is provided on a sidewall of the lower electrode that protrudes from the surface of the first insulating layer. A second insulating layer is provided on the first insulating layer and includes a second opening therein at least partially exposing the lower electrode. A variable resistance material layer extends into the second opening to contact the lower electrode. The electrode passivation layer electrically separates the sidewall of the lower electrode from the variable resistance material layer. The electrode passivation pattern is formed of a material having an etching selectivity to that of the second insulating layer. Related fabrication methods are also discussed.

19 Claims, 18 Drawing Sheets

VARIABLE RESISTANCE MEMORY DEVICES HAVING REDUCED RESET CURRENT

CROSS-REFERENCE TO RELATED APPLICATIONS

This U.S. non-provisional patent application claims priority under 35 U.S.C. §119 from Korean Patent Application No. 10-2010-0032381, filed on Apr. 8, 2010, the disclosure of which is hereby incorporated by reference herein in its entirety.

BACKGROUND

The present disclosure herein relates to integrated circuit devices, and more particularly, to a nonvolatile memory devices and methods of manufacturing the same.

Semiconductor devices may be classified into memory devices and logic devices. The memory devices may store data therein. In general, semiconductor memory devices may be classified into volatile memory devices and nonvolatile memory devices. Volatile memory devices may lose data stored therein upon interruption of power supplied thereto. Volatile memory devices may include, for example, dynamic random access memory (DRAM) and static random access memory (SRAM). Nonvolatile memory devices do not lose data stored therein even when power supplied thereto is interrupted. For example, nonvolatile memory devices may include programmable read-only memory (PROM), erasable PROM (EPROM), electrically EPROM (EEPROM), and flash memory devices.

In order to achieve higher performance and lower power consumption, there have been developed next generation semiconductor memory devices, such as a ferroelectric RAM (FRAM), magnetic RAM (MRAM), and phase-change RAM (PRAM). Materials of such next-generation semiconductor memory devices may be operable to provide varying resistance values in response to a current or a voltage, and may be operable to maintain such programmed resistance values in spite of interruption of the current or the voltage.

SUMMARY

The present disclosure provides resistance variable memory devices having improved electrical characteristics and reliability and methods of manufacturing the same.

Objects of the inventive concept are not limited thereto. That is, other objects will be apparently understood from the following description by those skilled in the art.

Some embodiments of the inventive concept provide a nonvolatile memory device including a substrate and a first insulating layer on the substrate. The first insulating layer includes a first opening therein, and a lower electrode is provided in the first opening and protrudes from a surface of the first insulating layer outside the first opening. An electrode passivation pattern is provided on a sidewall of the lower electrode that protrudes from the surface of the first insulating layer. A second insulating layer is provided on the first insulating layer and includes a second opening therein at least partially exposing the lower electrode. A variable-resistance material layer extends into the second opening to contact the lower electrode, and the electrode passivation layer electrically separates the sidewall of the lower electrode from the variable resistance material layer.

In some embodiments, the electrode passivation pattern may be formed of a material having an etching selectivity to that of the second insulating layer.

In some embodiments, the first insulating layer may be formed of a material that does not have an etching selectivity to that of the second insulating layer.

In some embodiments, a word line may be provided on the substrate. A portion of the word line may be exposed by the first opening in the first insulating layer such that the lower electrode may provide an electrical connection between the word line and the variable resistance material layer.

In some embodiments, an upper electrode may be provided on the variable resistance material layer opposite the lower electrode, and a bit line may be provided on the upper electrode. The upper electrode may provide an electrical connection between the bit line and the variable resistance material layer.

In some embodiments, a diode may be provided in the first opening in the first insulating layer electrically contacting the word line. A silicide layer may be provided on the diode such that the silicide layer may be between the lower electrode and the diode.

In some embodiments, the lower electrode may include a conductive layer on a sidewall of the first opening in the first insulating layer, and a third insulating layer on the conductive layer. The third insulating layer may be formed of a material having an etching selectivity to that of the first insulating layer.

In some embodiments, the conductive layer may extend on opposing sidewalls of the opening in the first insulating layer, and the third insulating layer may extend between the opposing sidewalls.

In some embodiments, the electrode passivation layer may include sidewall spacers extending on opposing sidewalls of the conductive layer that protrude outside the first opening in the first insulating layer.

In some embodiments, the electrode passivation layer may extend on the sidewall of the lower electrode and along the surface of the substrate outside the opening in the first insulating layer.

In some embodiments, the electrode passivation layer may be a sidewall spacer extending between the lower electrode and the first insulating layer along a sidewall of the first opening therein.

In some embodiments, the variable resistance material layer may be a phase changeable material layer configured to transition between an amorphous state and a crystalline state responsive to heat applied thereto.

Additional embodiments of the inventive concept provide a method of fabricating a nonvolatile memory device. The method includes forming a first insulating layer on a substrate, including a first opening in the first insulating layer. A lower electrode is formed in the first opening and protrudes from a surface of the first insulating layer outside the first opening. An electrode passivation layer is formed on a sidewall of the lower electrode that protrudes from the first opening. A second insulating layer is formed on the first insulating layer and includes a second opening therein at least partially exposing the lower electrode. A variable resistance material layer is formed extending into the second opening to contact the lower electrode. The electrode passivation layer electrically separates the sidewall of the lower electrode from the variable resistance material layer.

In some embodiments, the electrode passivation layer may be formed of a material having an etching selectivity to that of the second insulating layer. The second insulating layer may be selectively etched to form the second opening therein without substantially etching the electrode passivation layer.

In some embodiments, forming the lower electrode protruding from the surface of the first insulating layer may include forming a conductive layer on a sidewall of the first opening in the first insulating layer, and forming a third insulating layer on the conductive layer. The third insulating layer may be formed of a material having an etching selectivity to that of the first insulating layer. The first insulating layer may be selectively recessed without substantially removing the third insulating layer and the conductive layer.

In some embodiments, the conductive layer may be formed on opposing sidewalls of the opening in the first insulating layer, and the third insulating layer may be formed on the conductive layer between the opposing sidewalls.

In some embodiments, the electrode passivation layer may be formed as sidewall spacers extending on opposing sidewalls of the conductive layer that protrude outside the first opening in the first insulating layer.

In some embodiments, the electrode passivation layer may be formed on the sidewall of the lower electrode and along the surface of the substrate outside the opening in the first insulating layer.

In some embodiments, the electrode passivation layer may be formed as a sidewall spacer extending along opposing sidewalls of the first opening, and the lower electrode may be formed in the first opening on the sidewall spacer.

Further embodiments of the inventive concept provide a nonvolatile memory device including a substrate and a word line on the substrate. A first insulating layer is provided on the substrate, and includes a first opening therein at least partially exposing the word line. A diode is provided in the first opening in the first insulating layer and electrically contacting the word line. A silicide layer is provided on the diode, and a lower electrode is provided on the silicide layer in the first opening. The lower electrode protrudes from a surface of the first insulating layer outside the first opening. An electrode passivation pattern is provided on a sidewall of the lower electrode that protrudes from the surface of the first insulating layer. A second insulating layer is provided on the first insulating layer and includes a second opening therein at least partially exposing the lower electrode. The electrode passivation pattern includes a material having an etching selectivity to that of the second insulating layer. A variable resistance material layer is provided extending into the second opening to contact the lower electrode. The electrode passivation layer electrically separates the sidewall of the lower electrode from the variable resistance material layer. An upper electrode is provided on the variable resistance material layer opposite the lower electrode, and a bit line is provided on the upper electrode.

Still further embodiments of the inventive concept provide methods of manufacturing a resistance variable memory device, the methods including forming a first interlayer dielectric which comprises an opening on a substrate; forming an electrode passivation pattern on a sidewall of the opening; forming a lower electrode which fills the opening; forming a second interlayer dielectric which comprises a recess region exposing an upper surface of the lower electrode on the first interlayer dielectric; and forming a resistance variable material layer in the recess region, wherein the upper surface of the lower electrode is higher than an upper surface of the first interlayer dielectric exposed by the recess region.

In some embodiments, the electrode passivation pattern may have an etch selectivity with respect to the first interlayer dielectric and the second interlayer dielectric.

In other embodiments, the forming of the recess region may include removing part of the exposed upper surface of the first interlayer dielectric.

In still other embodiments, the electrode passivation pattern may be formed by a spacer process.

In even other embodiments, the resistance variable material layer may cover an upper sidewall of the electrode passivation pattern.

In other embodiments of the inventive concept, methods of manufacturing a resistance variable memory device include forming a first interlayer dielectric which comprises an opening on a substrate; forming a lower electrode in the opening; recessing the first interlayer dielectric such that an upper sidewall of the lower electrode is exposed; forming an electrode passivation layer which covers the exposed sidewall of the lower electrode on the first interlayer dielectric; forming a second interlayer dielectric on the electrode passivation layer; and forming a recess region which exposes an upper surface of the lower electrode by patterning the second interlayer dielectric, wherein the electrode passivation layer has an etch selectivity with respect to the second interlayer dielectric.

In some embodiments, the patterning may include patterning the electrode passivation layer and thereby forming an electrode passivation pattern in the form of a spacer which covers the upper sidewall of the lower electrode.

In other embodiments, the recess region may expose part of an upper surface of the first interlayer dielectric, and the exposed upper surface of the first interlayer dielectric may be lower than the upper surface of the lower electrode.

In still other embodiments, the method may further include forming a dielectric pattern which fills the opening on the lower electrode, and the dielectric pattern may have an etch selectivity with respect to the first interlayer dielectric and the second interlayer dielectric.

In even other embodiments, the method may further include forming an electrode passivation pattern which exposes the upper surface of the lower electrode by planarizing the electrode passivation layer.

In yet other embodiments, the recessing of the first interlayer dielectric may include selectively etching the first interlayer dielectric.

In further embodiments, the forming of the low electrode may include forming a lower electrode layer on a sidewall and a bottom surface of the opening; forming a third dielectric layer which fills the opening; and planarizing the lower electrode and the third dielectric layer to thereby expose the first interlayer dielectric.

In still further embodiments, the method may further include forming a mask layer which covers part of the upper surface of the lower electrode; removing part of the upper surface of the lower electrode exposed by the mask layer; and forming a fourth dielectric layer on the removed part.

In still other embodiments of the inventive concept, resistance variable memory devices include a first interlayer dielectric disposed on a substrate, comprising an opening; a lower electrode disposed in the opening; a second interlayer dielectric disposed on the first interlayer dielectric, comprising a recess region which exposes the lower electrode; an electrode passivation pattern disposed on a sidewall of the lower electrode and made of a material having an etch selectivity with respect to the second interlayer dielectric; and a resistance variable material layer disposed in the recess region.

In some embodiments, an upper surface of the lower electrode may be disposed higher than an upper surface of the first interlayer dielectric exposed by the recess region.

In some embodiments, the electrode passivation pattern may have an etch selectivity with respect to the first interlayer dielectric and the second interlayer dielectric.

In other embodiments, the electrode passivation pattern may be disposed on an inner sidewall of the opening.

In still other embodiments, an upper surface of the electrode passivation pattern may be coplanar with the upper surface of the lower electrode.

In even other embodiments, the electrode passivation pattern may be disposed on the first interlayer dielectric.

In yet other embodiments, the electrode passivation pattern may be in the form of a spacer.

In further embodiments, an upper surface of the electrode passivation pattern may be coplanar with the upper surface of the lower electrode.

In still further embodiments, the lower electrode may be a ring type, a half ring type, or a linear type.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIGS. 2A to 7A are sectional views of FIG. 1, cut along a line x-x', to illustrate a resistance variable memory device according to a first embodiment of the inventive concept and a manufacturing method thereof;

FIGS. 2B to 7B are sectional views of FIG. 1, cut along a line y-y', to illustrate the resistance variable memory device according to the first embodiment of the inventive concept and the manufacturing method thereof;

FIGS. 8A to 13A are sectional views of FIG. 1, cut along a line x-x', to illustrate a resistance variable memory device according to a second embodiment of the inventive concept and a manufacturing method thereof;

FIGS. 8B to 13B are sectional views of FIG. 1, cut along a line y-y', to illustrate a resistance variable memory device according to the second embodiment of the inventive concept and a manufacturing method thereof;

FIGS. 14A to 17A are sectional views of FIG. 1, cut along a line x-x', to illustrate a resistance variable memory device according to a third embodiment of the inventive concept and a manufacturing method thereof;

FIGS. 14B to 17B are sectional views of FIG. 1, cut along a line y-y', to illustrate a resistance variable memory device according to the third embodiment of the inventive concept and a manufacturing method thereof.

DETAILED DESCRIPTION

Figure 1:
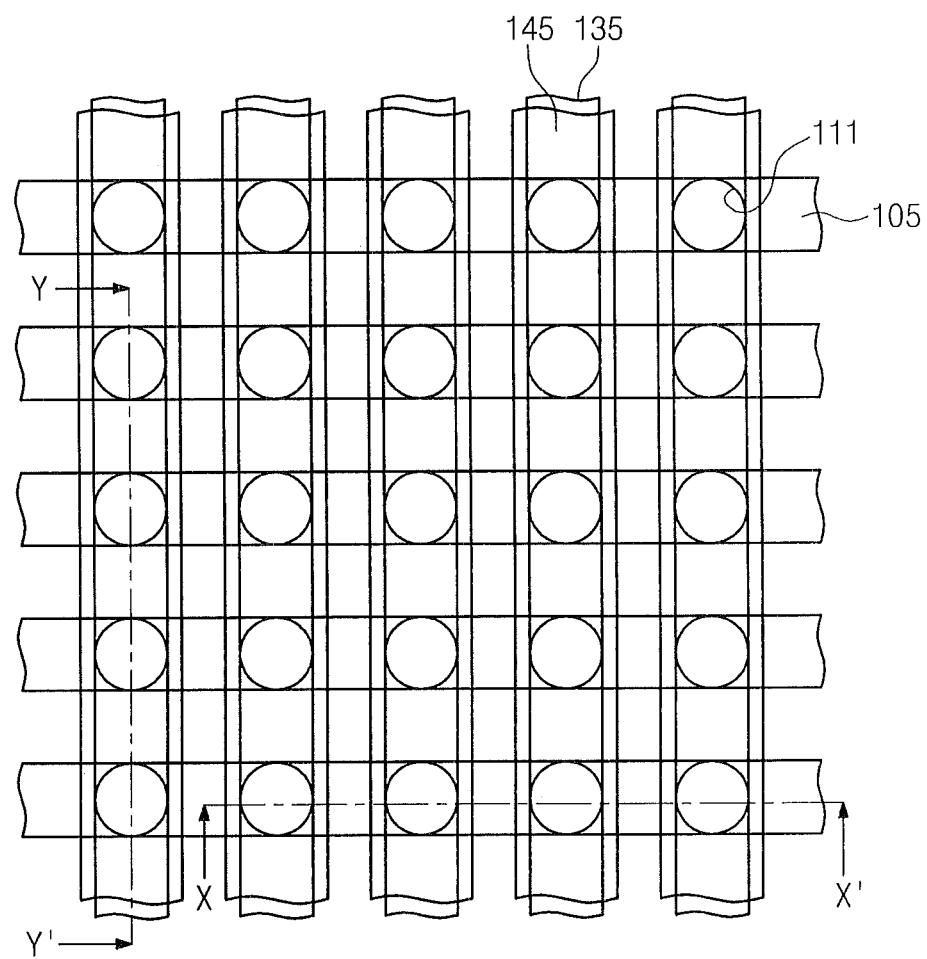
FIG. 1 is a plan view illustrating a resistance variable memory device and a memory cell array according to embodiments of the inventive concept.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that when an element or layer a layer (or film) such as a conductive layer, a semiconductor layer, and a dielectric layer is referred to as being "on," "connected to" or "coupled to" another element or layer, it can be directly on, connected or coupled to the other element or layer or intervening elements or layers may be present. In contrast, when an element is referred to as being "directly on," "directly connected to," "directly coupled to," or "in direct contact with" another element or layer, there are no intervening elements or layers present. Other expressions for describing relationships between elements, for example, "between" and "immediately between" or "neighboring" and "directly neighboring" may also be understood likewise.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. As used herein, the term "and/or" includes any and all combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, the technical terms are used only for explaining a specific exemplary embodiment while not limiting the present inventive concept. The meaning of "include," "comprise," "including," or "comprising," specifies a property, a region, a fixed number, a step, a process, an element and/or a component but does not exclude other properties, regions, fixed numbers, steps, processes, elements and/or components.

Additionally, the embodiments in the detailed description will be described with reference to cross-sectional views as ideal exemplary views of the present inventive concept. In the figures, the dimensions of layers and regions are exaggerated for clarity of illustration. Accordingly, shapes of the exemplary views may be modified according to manufacturing techniques and/or allowable errors or tolerances. Therefore, the embodiments of the present inventive concept are not limited to the specific shapes illustrated in the exemplary views, but may include other shapes that may be created according to manufacturing processes. For example, an etched region illustrated as a rectangle may have rounded or curved features. Areas exemplified in the drawings have general properties, and are used to illustrate a specific shape of a semiconductor package region. Thus, the regions illustrated in the figures are not intended to limit the scope of the present inventive concept.

Hereinafter, a semiconductor device and a manufacturing method thereof according to embodiments of the inventive concept will be described in detail with reference to the accompanying drawings.

FIG. 1 is a plan view showing a memory cell array of a resistance variable memory device according to embodiments of the inventive concept. A plurality of word lines 105 and a plurality of bit lines 145 extending substantially perpendicular to the word lines 105 are provided. Memory cells may be provided at intersection points between the word lines 105 and the bit lines 145. The memory cells may each be disposed in an opening 111 and include a variable resistor as a memory element. The variable resistor may include a phase change material layer, such as Ge2Sb2Te5 (GST), having a crystal structure that can be reversibly changed by a signal applied thereto, for example, an electrical signal such as a voltage or a current, an optical signal, and/or radiation. Variable-resistance material layers 135 (also referred to herein as resistance variable material layers) covering the memory cells may extend across the respective word lines 105.

FIGS. 2A to 7A are cross-sectional views of FIG. 1, taken along a line X-X', to illustrate a resistance variable memory device according to some embodiments of the inventive concept and related manufacturing methods. FIGS. 2B to 7B are cross-sectional views of FIG. 1, taken along a line Y-Y', to illustrate the resistance variable memory device according to some embodiments of the inventive concept and the related manufacturing methods.

Figure 2A:
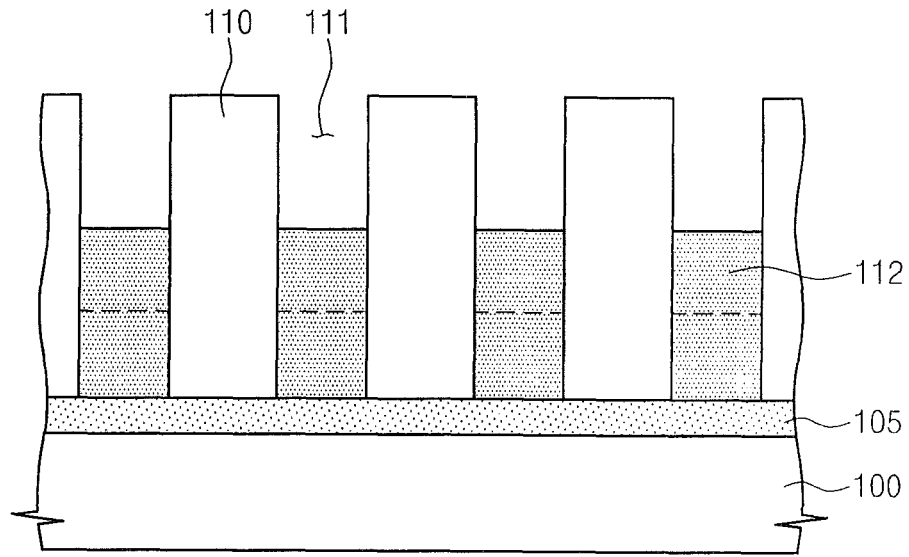
Figure 2B:
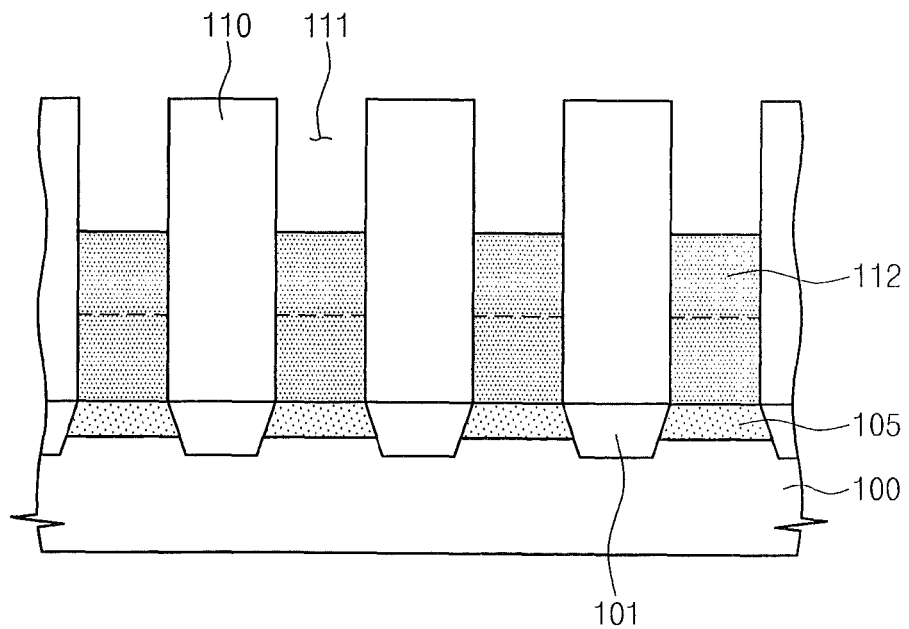

Referring to FIGS. 2A and 2B, a device isolation layer 101 defining active regions is formed on a substrate 100. The substrate 100 may refer to a semiconductor-based structure in some embodiments. For example, the semiconductor-based structure may include silicon, silicon on insulator (SOI), silicon germanium (SiGe), germanium (Ge), gallium arsenide (GaAs), and/or a silicon epitaxial layer supported by a semiconductor structure such as doped or undoped silicon. In some embodiments of the inventive concept, the substrate 100 may be a P-type silicon substrate doped with P-type impurities. The device isolation layer 101 may be formed by a shallow trench isolation (STI) process.

The plurality of word lines 105 may be formed on the substrate 100 by implanting impurity ions in the active regions of the substrate 100. For example, in the case where the substrate 100 is a P-type silicon substrate, the word lines 105 may be formed by implanting N-type impurity ions. However, the word lines 105 may be formed in various other ways. For example, the word lines may be formed by implanting impurity ions after a plurality of epitaxial semiconductor layers are formed on the semiconductor substrate 100 or by doping epitaxial semiconductor layers with impurities simultaneously with formation of the epitaxial semiconductor layers. For another example, the word lines 105 may be thin metal layers.

A first interlayer dielectric 110 including the openings 111 may be formed on the substrate 100. Here, the first interlayer dielectric 110 may be an oxide layer. A selection device, such as a diode 112, may be provided at a lower part of each of the openings 111. The diode 112 may be formed by forming an epitaxial layer (not shown) in the opening 111, performing an etch-back process, and then doping the epitaxial layer with impurity elements. The impurity elements may include N-type and/or P-type impurities.

Figure 3A:
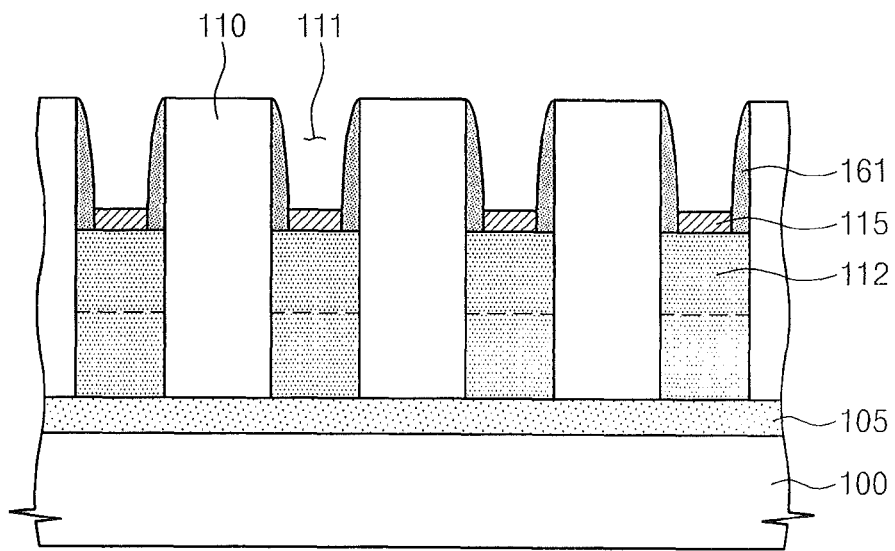
Figure 3B:
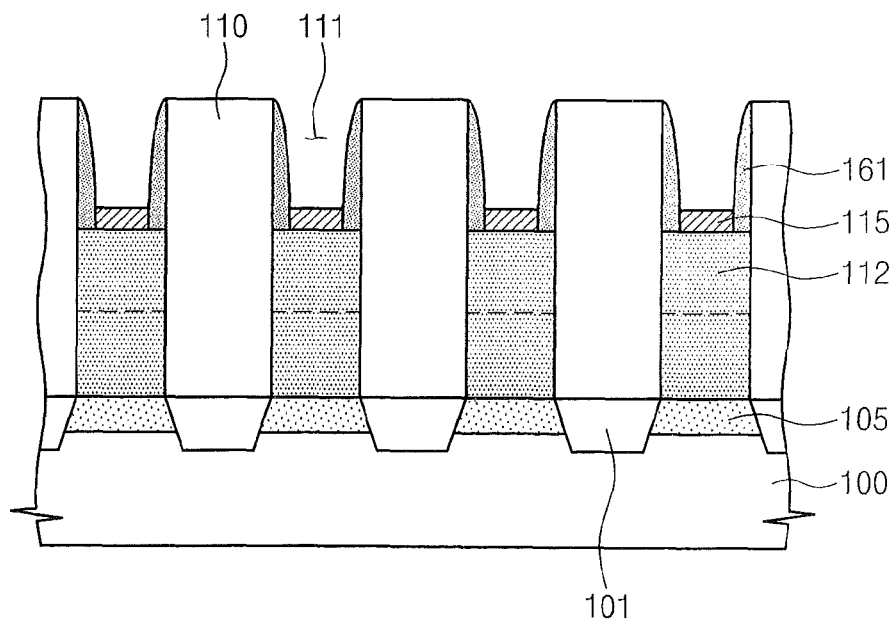

Referring to FIGS. 3A and 3B, an electrode passivation pattern 161 may be formed on an inner wall of the opening 111. The electrode passivation pattern 161 may be formed by performing a spacer process on the diode 112. More specifically, the electrode passivation pattern 161 may be formed by forming an electrode passivation layer on the diode 112 and the first interlayer dielectric 110 and then performing an etch-back process. The electrode passivation pattern 161 may be made of a material having an etch selectivity with respect to the first interlayer dielectric 110 and a second interlayer dielectric that will be described hereinafter. For example, when the first interlayer dielectric 110 is a silicon oxide layer, the electrode passivation pattern 161 may be made of a silicon nitride layer. The electrode passivation pattern 161 may expose an upper surface of the diode 112 and a silicide layer 115 may be formed on the exposed diode 112. The silicide layer 115 may reduce a contact resistance between the diode 112 and a lower electrode that will be described hereinafter. For example, the silicide layer 115 may be made of a metal silicide such as cobalt silicide, nickel silicide, or titanium silicide. FIGS. 3A and 3B shows the silicide layer 115 formed after formation of the electrode passivation pattern 161. However, the silicide layer 115 may be formed before formation of the electrode passivation pattern 161.

Figure 4A:
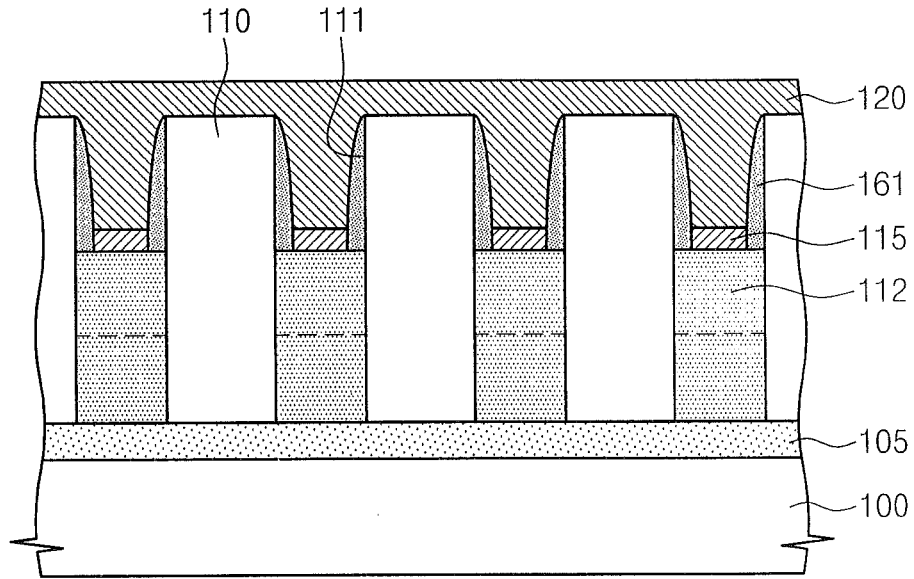
Figure 4B:
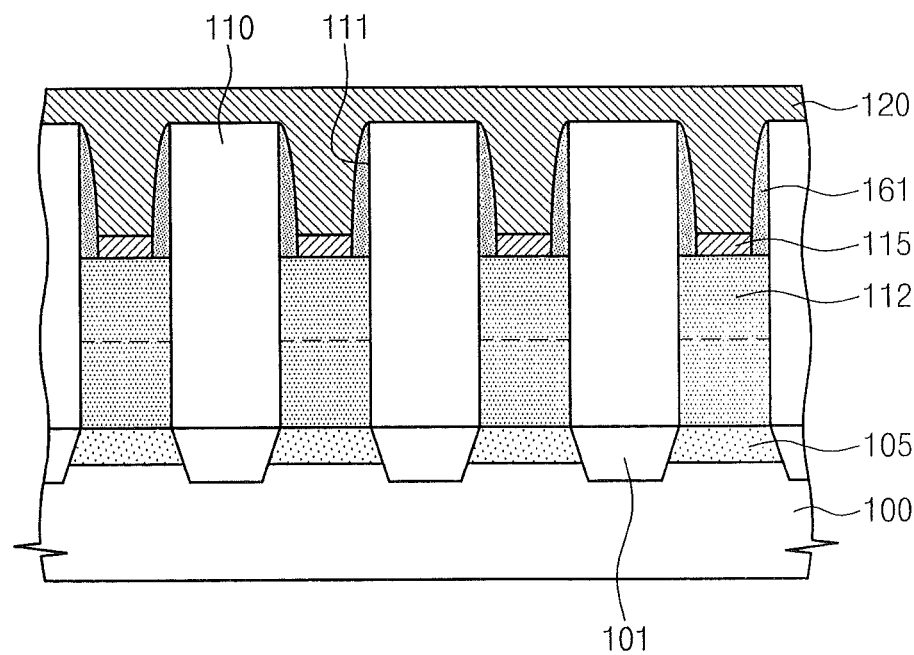

Referring to FIGS. 4A and 4B, a lower electrode layer 120 filling the openings 111 may be formed. The lower electrode layer 120 may be surrounded by the electrode passivation pattern 161 in the opening 111. The lower electrode layer 120 may be formed of at least one selected from a transition metal, a conductive transition metal nitride, and a conductive three component nitride. The lower electrode layer 120 may be formed by sputtering or plasma-enhanced chemical vapor deposition (PECVD).

Figure 5A:
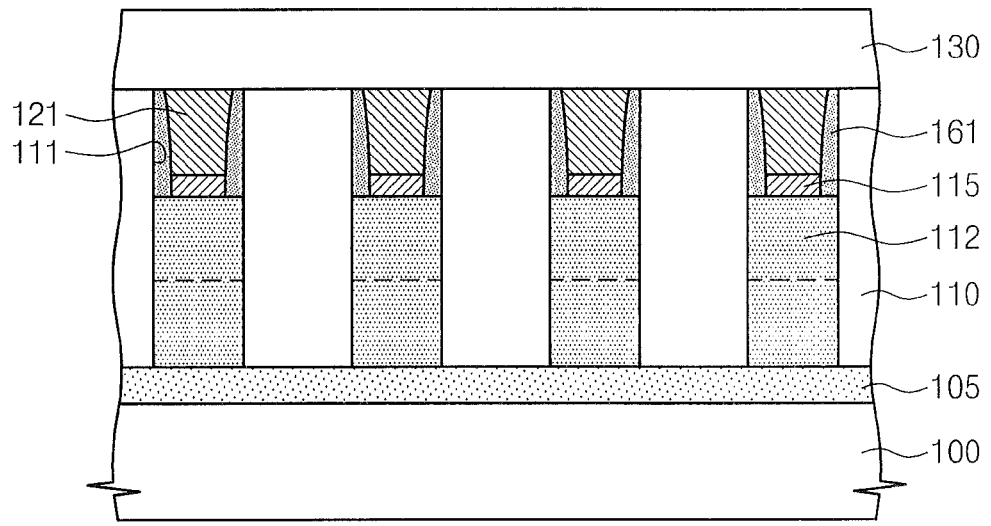
Figure 5B:
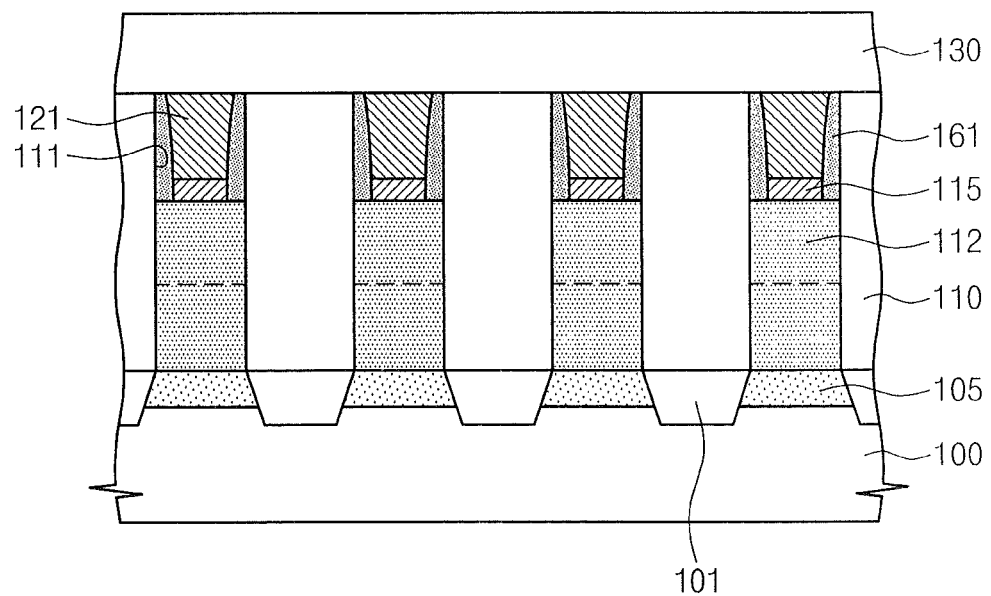

Referring to FIGS. 5A and 5B, the lower electrode layer 120 is planarized, thereby forming lower electrodes 121. The lower electrodes 121 maybe a plug shape. A shape of the lower electrode 121 is not specifically limited but may include a ring type, a half ring type, or a linear type. An upper surface of the electrode passivation pattern 161 may be exposed by the planarization. The planarization may be a chemical mechanical polishing (CMP) process or the etch-back process. A second interlayer dielectric 130 may be formed on the first interlayer dielectric 110 and the lower electrodes 121. The second interlayer dielectric 130 may be formed using the same material and method as the first interlayer dielectric 110.

Figure 6A:
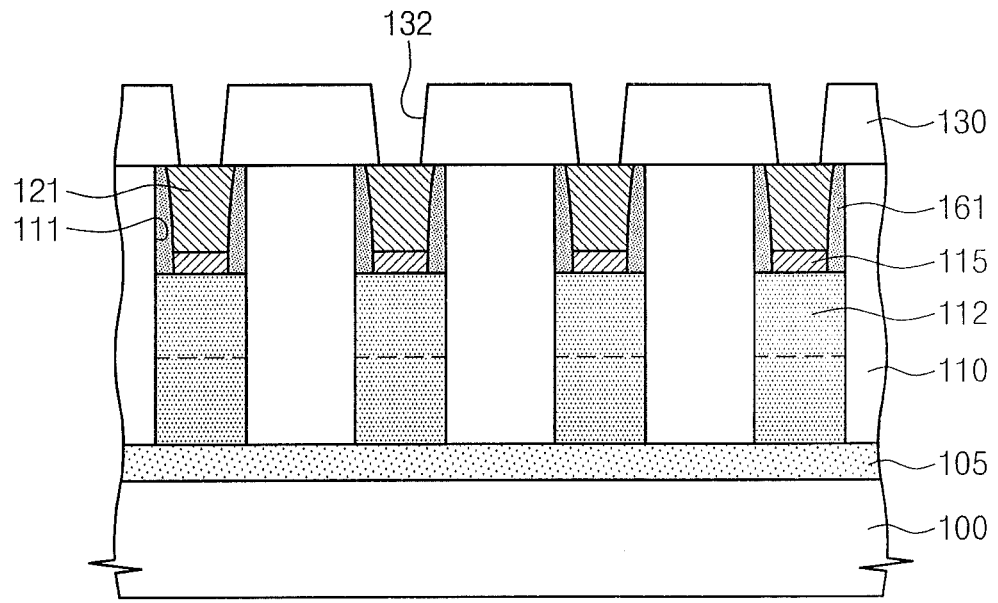
Figure 6B:
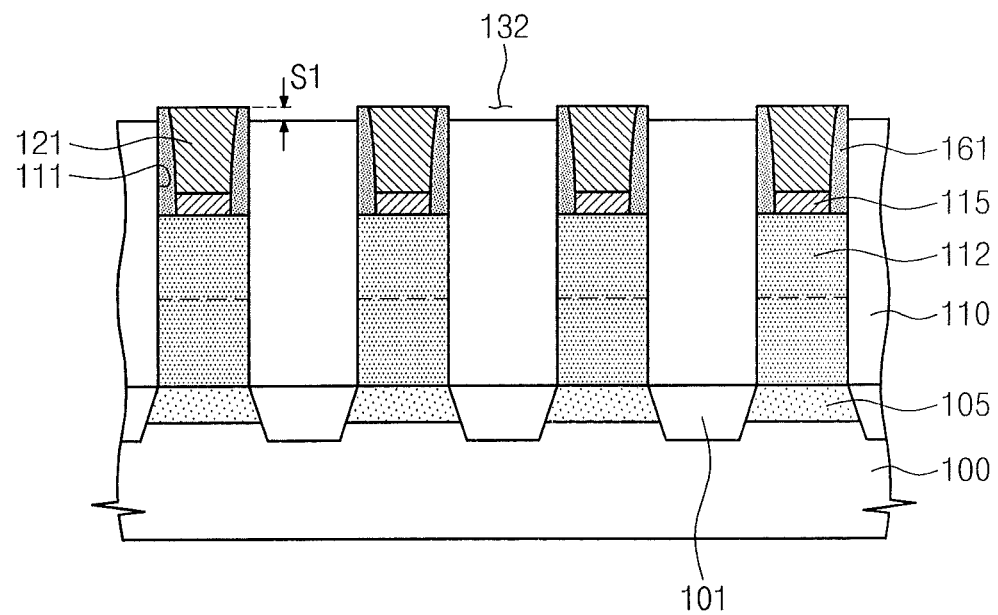

Referring to FIGS. 6A and 6B, recess regions 132 exposing upper surfaces of the respective lower electrodes 121 may be formed by patterning the second interlayer dielectric 130. The recess regions 132 may be trenches extending in a Y-Y' direction shown in FIG. 1. The patterning may be performed by dry or wet etching. Here, if the second interlayer dielectric 130 does not have an etch selectivity with respect to the first interlayer dielectric 110, the exposed upper surface of the first interlayer dielectric 110 may be etched during the patterning, thereby generating a step S1 between the upper surface of the first interlayer dielectric 110 and the upper surface of the lower electrode 121. An upper sidewall of the lower electrode 121 may be exposed by the step S1 if the electrode passivation pattern 161 is not provided. Accordingly, as a contact area with the resistance variable material layers increases, a reset current $I_{reset}$ may increase. When the reset current $I_{reset}$ is great, the current may not be efficiently supplied. According to the first embodiment, the electrode passivation pattern 161 having an etch selectivity with respect to the first and second interlayer dielectrics 110 and 130 is provided on the sidewall of the lower electrode 121. Therefore, exposure of the upper sidewall of the lower electrode 121 may be reduced and/or prevented by the electrode passivation pattern 161 during the patterning of the second interlayer dielectric 130. As a result, increase of the reset current $I_{reset}$ may be reduced and/or prevented.

Figure 7A:
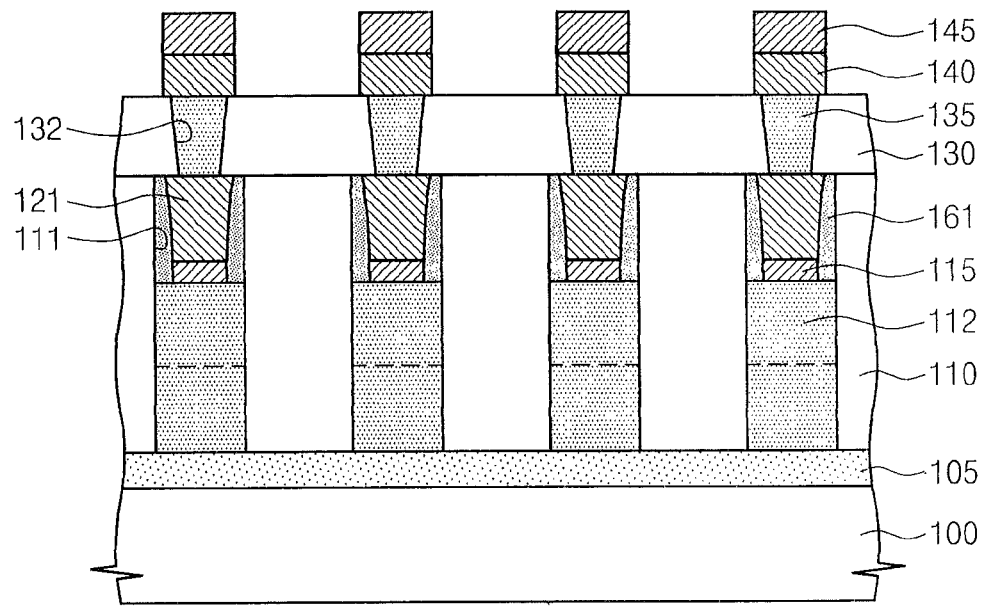
Figure 7B:
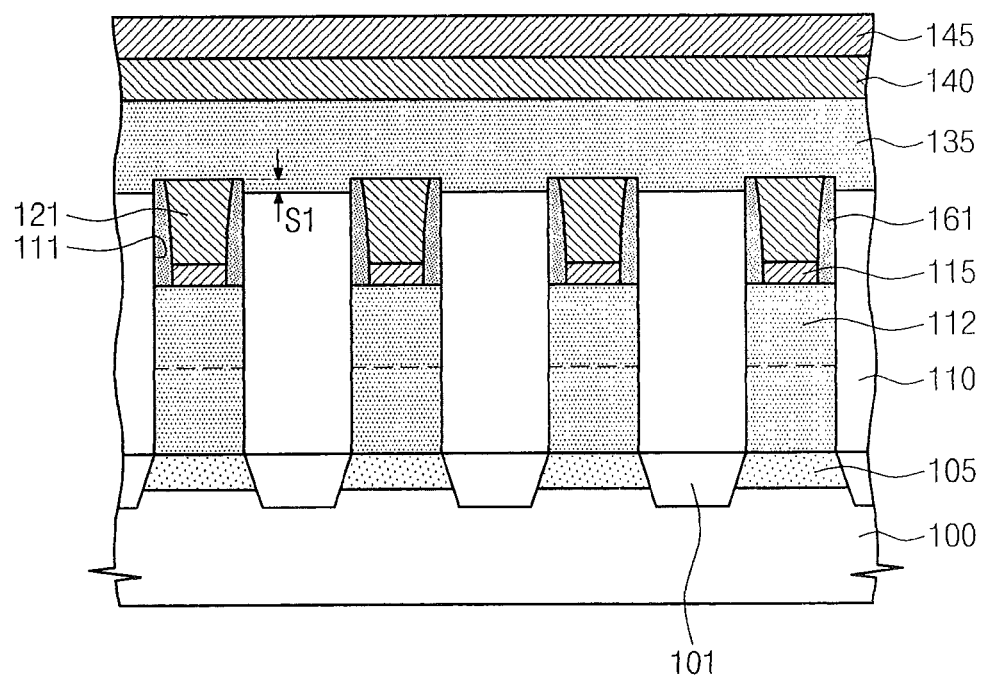

Referring to FIGS. 7A and 7B, the resistance variable material layers 135 may be formed in the recess regions 132. The resistance variable material layers 135 may extend in the Y-Y' direction shown in FIG. 1. Each of the resistance variable material layers 135 may cover the upper sidewall of the electrode passivation pattern 161. For example, the resistance variable material layer 135 may be a phase change material layer. When heated for a predetermined time at a temperature higher than its melting temperature Tm, the phase change material layer 135 changes to an amorphous state. When heated for a predetermined time at a temperature lower than the melting temperature Tm and higher than its crystallization temperature Tc and then cooled, the phase change material layer 135 changes to a crystallized state. Here, a specific resistance of the amorphous phase change material layer higher than a specific resistance of the crystallized phase change material layer. Therefore, whether data stored in the phase change material layer corresponds to logic "1" or logic "0" may be determined by detecting the current flowing through the phase change material layer in a readout mode. Here, a current to heat the phase change material layer to the amorphous state is the reset current $I_{reset}$. The phase change material layer may include a compound containing at least one of Te and Se which are chalcogenide-based elements and at least one selected from Ge, Sb, Bi, Pb, Sn, Ag, As, S, Si, P, O and C.

Upper electrodes 140 and the bit lines 145 may be formed on the respective resistance variable material layers 135. The upper electrode 140 may be formed of the same material as the lower electrode 121. The bit line 145 may be a thin metal layer and may be formed by a sputtering process.

According to the first embodiment of the inventive concept, increase of the reset current caused by the increase of the contact area between the resistance variable material layer 135 and the lower electrode 121 may be reduced and/or prevented.

Hereinafter, a resistance variable memory device according to a second embodiment and a method of manufacturing the same will be described.

Since the second embodiment is similar to the first embodiment except the configuration of the electrode passivation pattern and the lower electrode, technical features will not be repeatedly explained for conciseness.

Figure 8A:
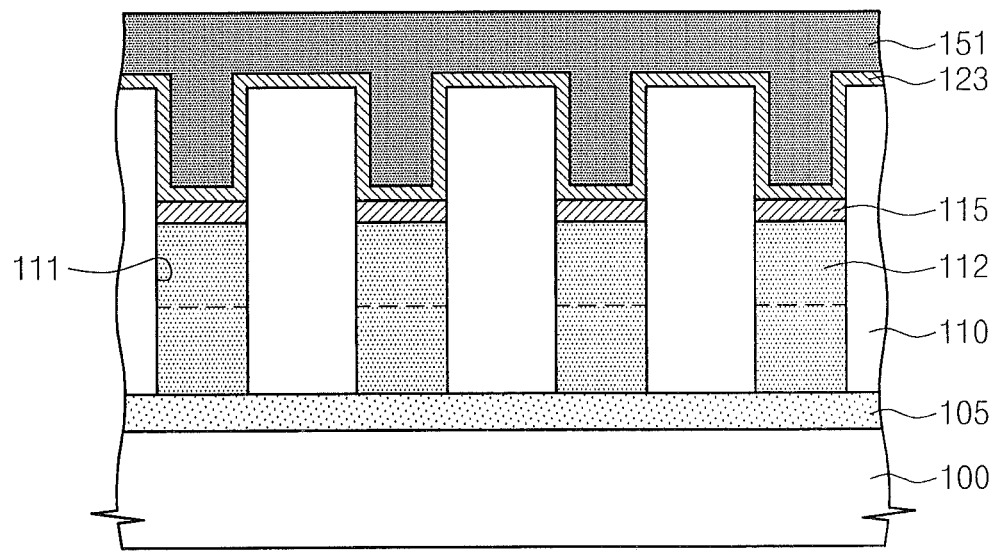
Figure 8B:
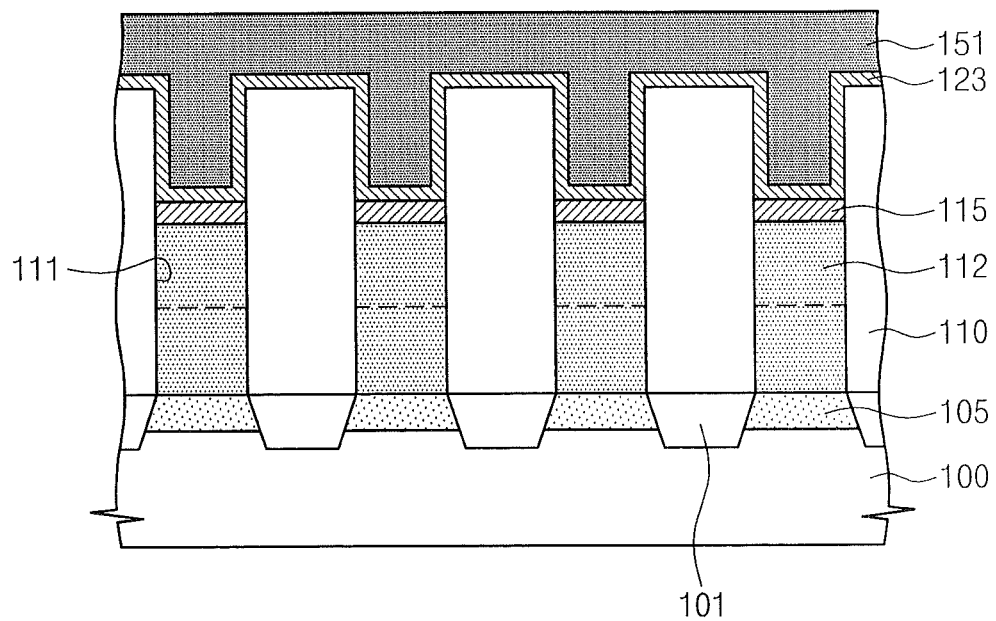

Referring to FIGS. 8A and 8B, a lower electrode layer 123 may be formed to cover the first interlayer dielectric 110 explained with reference to FIGS. 2A and 2B. The silicide layer 115 may be provided between the lower electrode layer 123 and each of the diodes 112. The lower electrode layer 123 is disposed on the sidewalls of the openings 111 and on the silicide layers 115, not fully filling the openings 111. The lower electrode layer 123 may include at least one selected from a transition metal, a conductive transition metal nitride, and a conductive three component nitride. The lower electrode layer 123 may be formed by sputtering or PECVD. A third dielectric layer 151 may be formed on the lower electrode layer 123. The third dielectric layer 151 may fully fill the openings 111 and may be formed of a material having an etch selectivity with respect to the first interlayer dielectric 110. For example, the third dielectric layer 151 may be a silicon nitride layer or a silicon oxynitride layer.

Figure 9A:
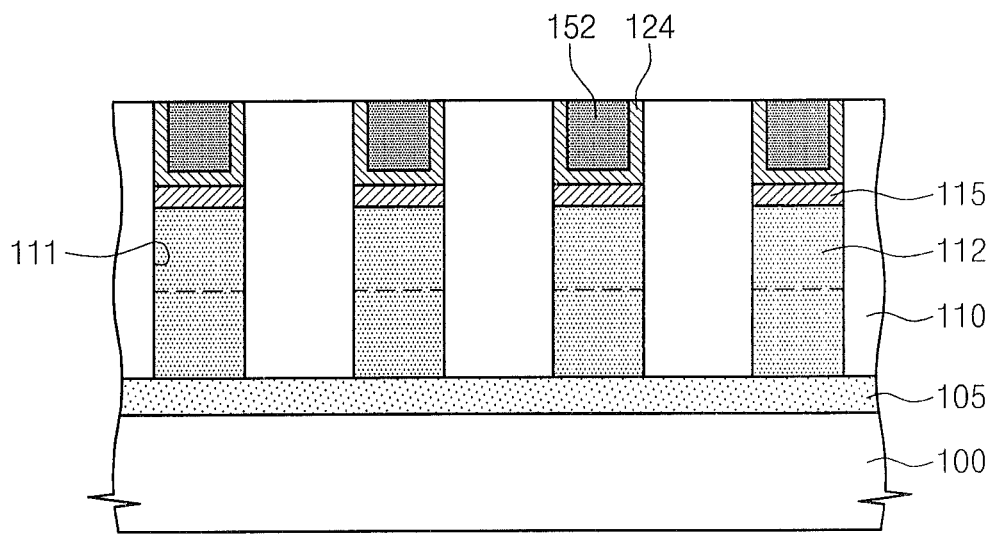
Figure 9B:
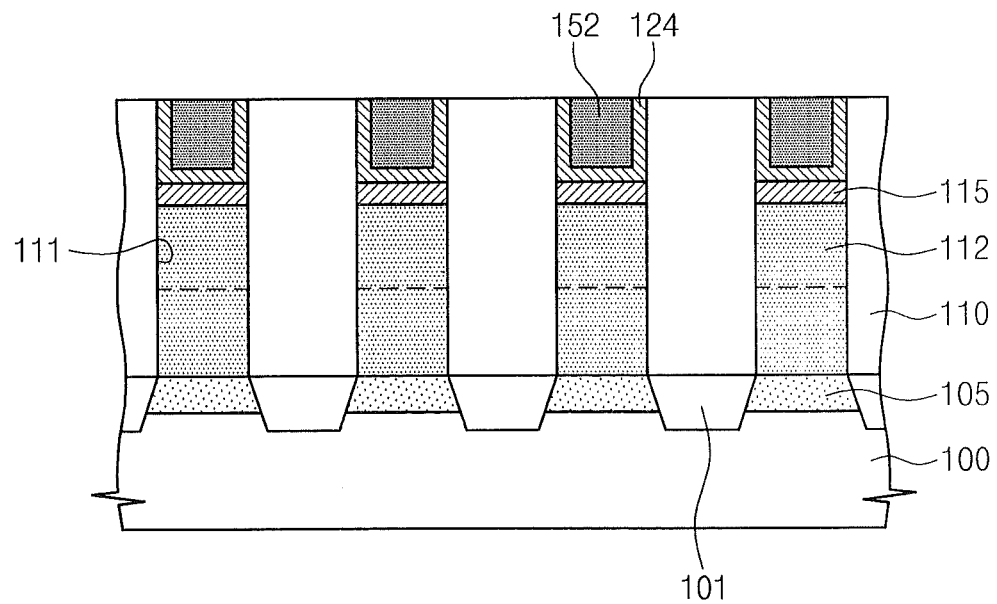

Referring to FIGS. 9A and 9B, a dielectric pattern 152 and a lower electrode 124 may be formed in each of the openings 111 by planarizing the third dielectric layer 151 and the lower electrode layer 123. The planarization may be performed by CMP or etch-back.

Figure 10A:
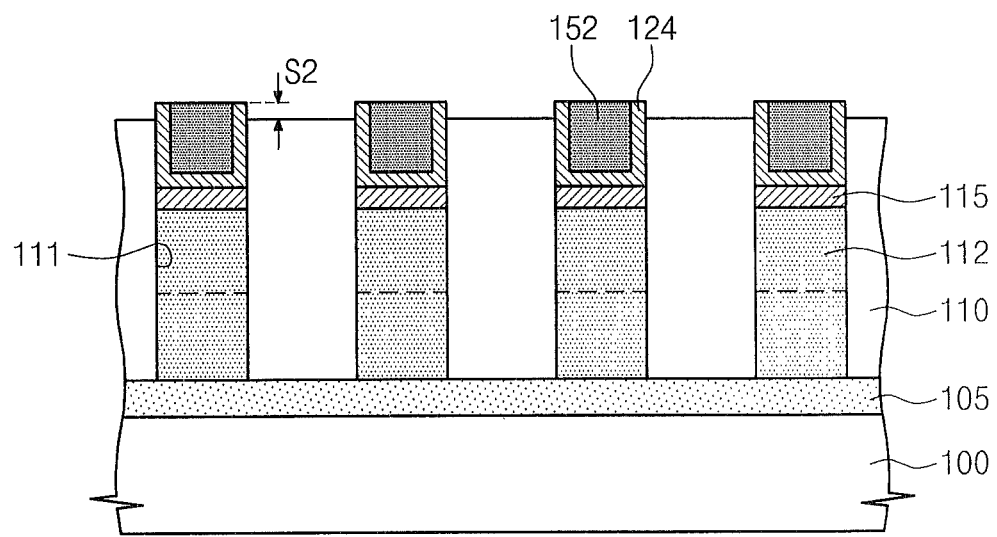
Figure 10B:
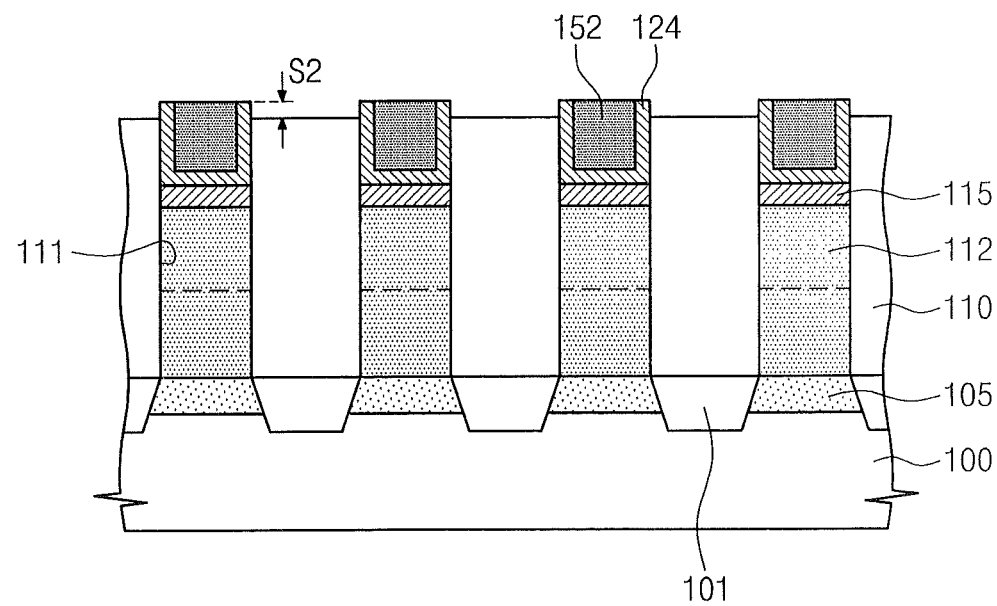

Referring to FIGS. 10A and 10B, the exposed upper surface of the first interlayer dielectric 110 may be recessed, thereby exposing upper sidewall of the lower electrode 124. Also, a step S2 may be generated between the upper surface of the first interlayer dielectric 110 and an upper surface of the lower electrode 124 by the recess process. The recess process may be selective etching including a dry or wet etching process.

Figure 11A:
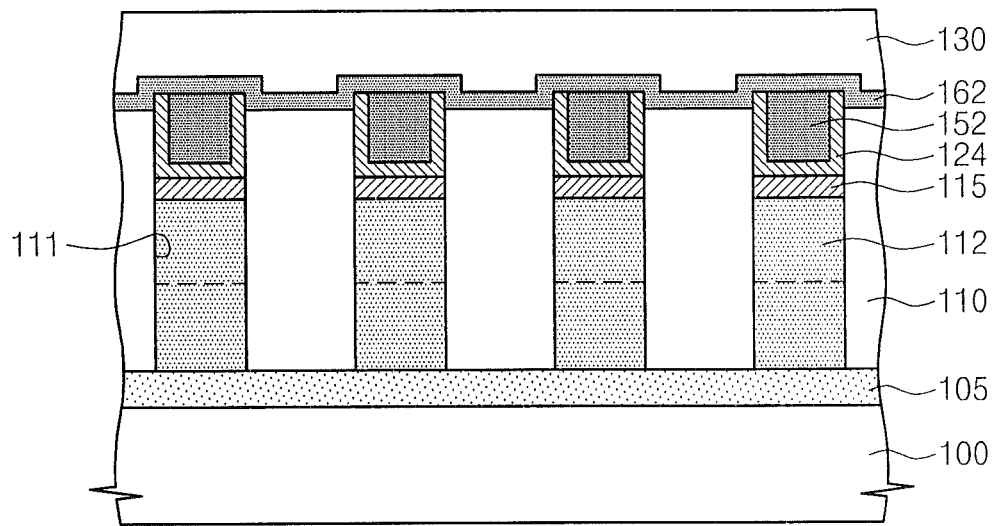
Figure 11B:
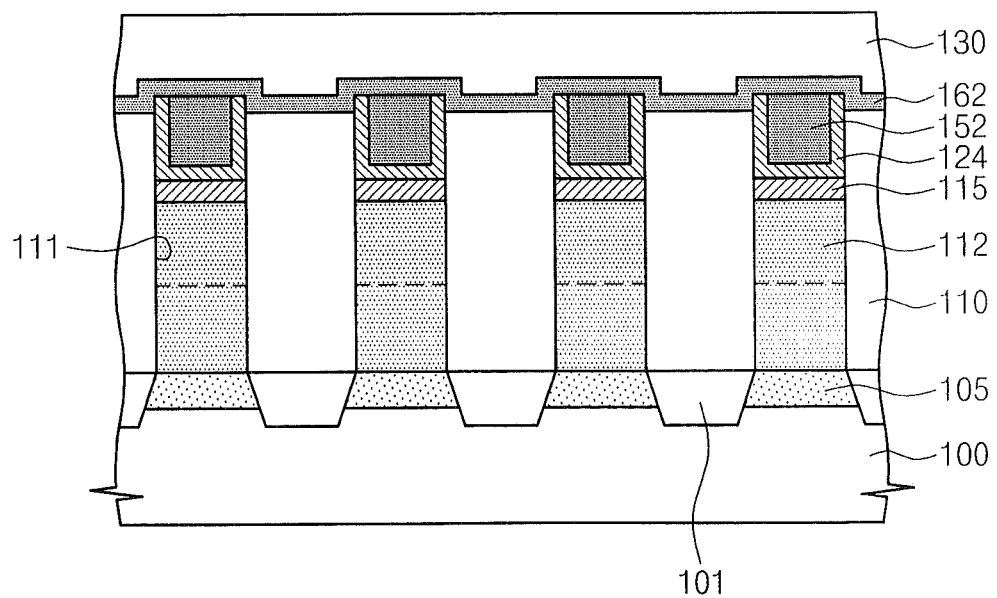

Referring to FIGS. 11A and 11B, an electrode passivation layer 162 may be formed on the first interlayer dielectric 110 and the lower electrodes 124. The electrode passivation layer 162 may be made of a material having an etch selectivity with respect to the first interlayer dielectric 110 and a second interlayer dielectric that will be described hereinafter. For example, when the first interlayer dielectric 110 is a silicon oxide layer, the electrode passivation pattern 161 may be made of a silicon nitride layer. A second interlayer dielectric 130 may be formed on the electrode passivation layer 162 and may be formed of the same material as the first interlayer dielectric 110.

Figure 12A:
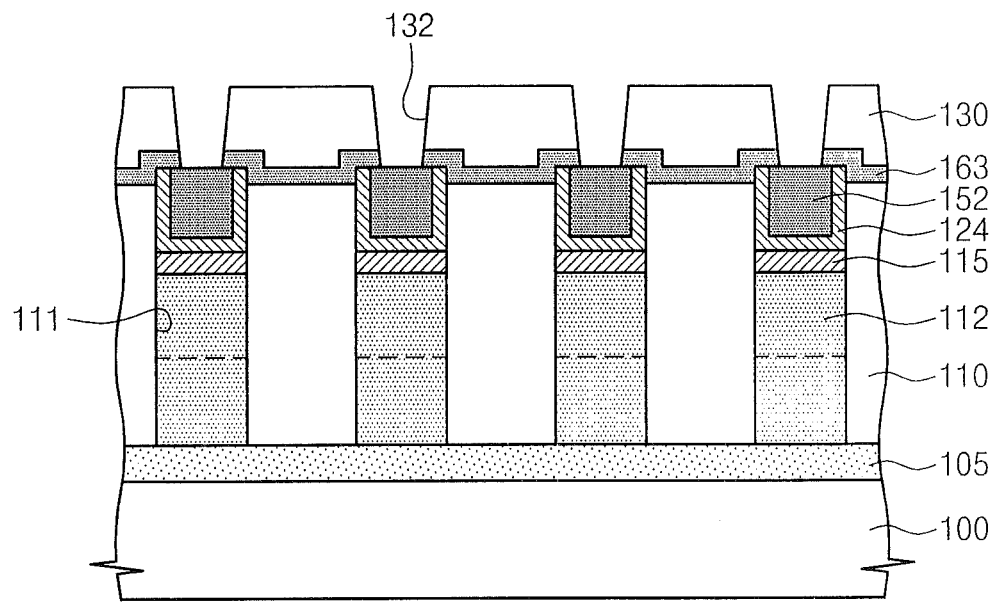
Figure 12B:
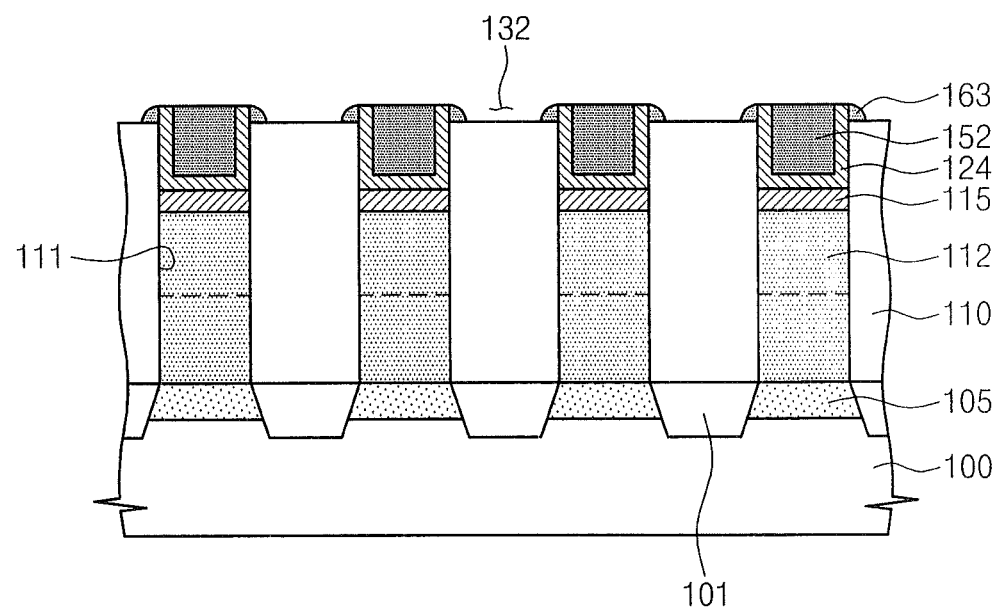

Referring to FIGS. 12A and 12B, recess regions 132 exposing the upper surfaces of the lower electrodes 124 may be formed by patterning the second interlayer dielectric 130. The recess regions 132 may be trenches extending in the Y-Y' direction of FIG. 1. The patterning may be performed by dry or wet etching. Electrode passivation patterns 163 may be formed as the electrode passivation layer 162 is also patterned during the patterning. The electrode passivation pattern 163 exposed by the recess region 132 may take the form of a spacer disposed on the upper sidewall of the lower electrode 124. In other words, the electrode passivation pattern 163 may be generated as the electrode passivation layer 162 partially remains on the upper sidewall of the lower electrode 124 due to the step S2. The upper surface of the first interlayer dielectric 110 may be exposed by the patterning. The electrode passivation pattern 163 remains on first interlayer dielectric 100 exposed by the recess region 132. The exposed upper surface of the first interlayer dielectric 110 may be lower than the upper surface of the lower electrode 124.

Figure 13A:
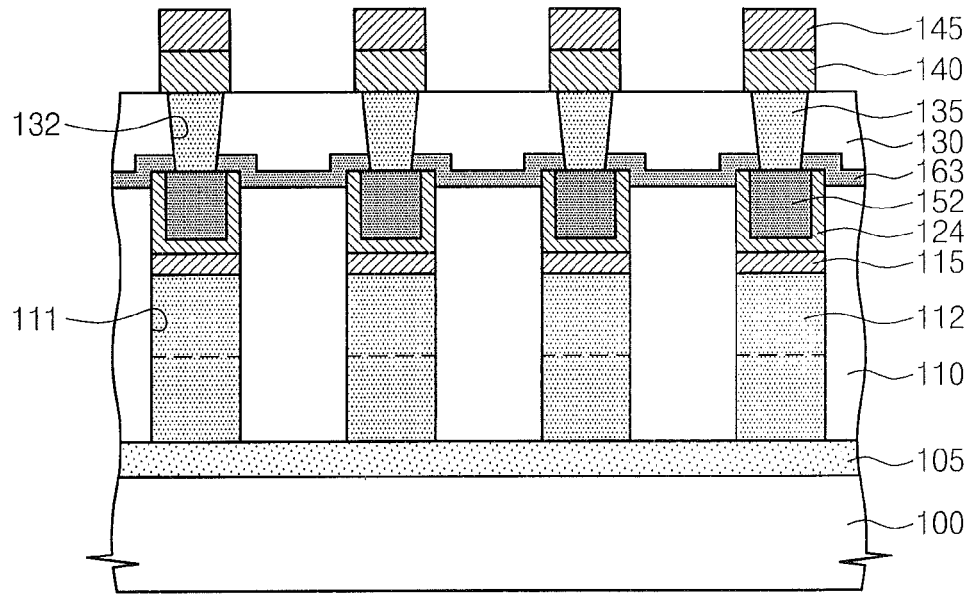
Figure 13B:
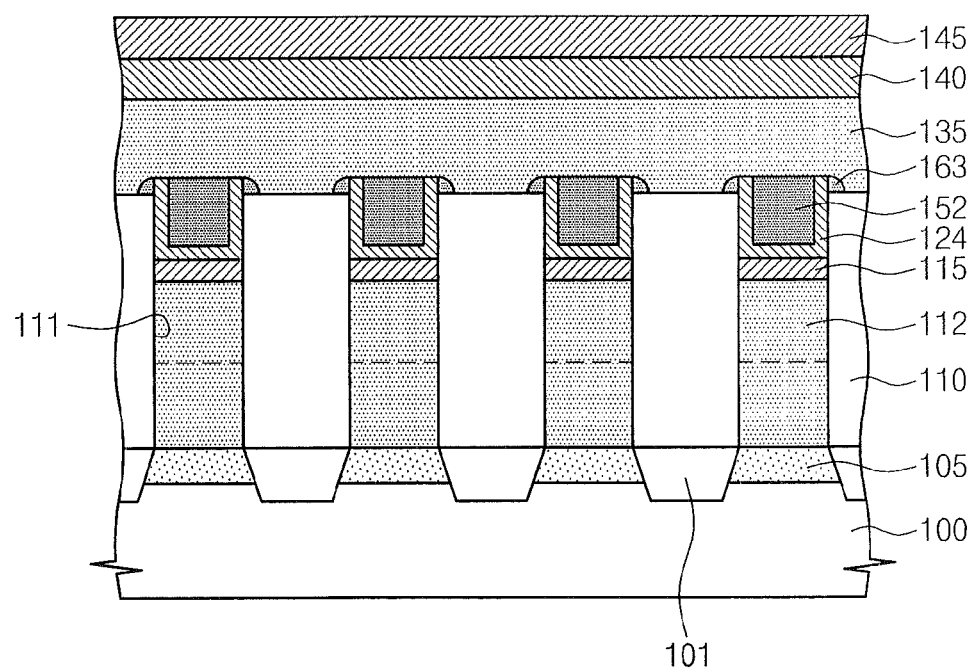

Referring to FIGS. 13A and 13B, the resistance variable material layers 135 may be formed in the recess regions 132. The resistance variable material layers 135 may extend in the Y-Y' direction as shown in FIG. 1. Also, the resistance variable material layers 135 may cover the electrode passivation patterns 163 exposed by the recess region 132. For example, the resistance variable material layer 135 may be a phase change material layer. The electrode passivation pattern 163 may prevent contact between and/or otherwise electrically separate the upper sidewall of the lower electrode 124 and the resistance variable material layer 135. Accordingly, the reset current may be reduced.

The upper electrodes 140 and the bit lines 145 may be formed on the respective resistance variable material layers 135. The upper electrode 140 may be formed of the same material as the lower electrode 124. The bit line 145 may be a thin metal layer and may be formed by a sputtering process.

According to the second embodiment, the reset current may be reduced since a contact area between the resistance variable material layer 135 and the lower electrode 124 is reduced.

Hereinafter, a resistance variable memory device according to a third embodiment of the inventive concept and a method of manufacturing the same will be described.

Since the third embodiment is similar to the first embodiment except the configuration of the electrode passivation pattern and the lower electrode, technical features will not be repeatedly explained for conciseness.

Figure 14A:
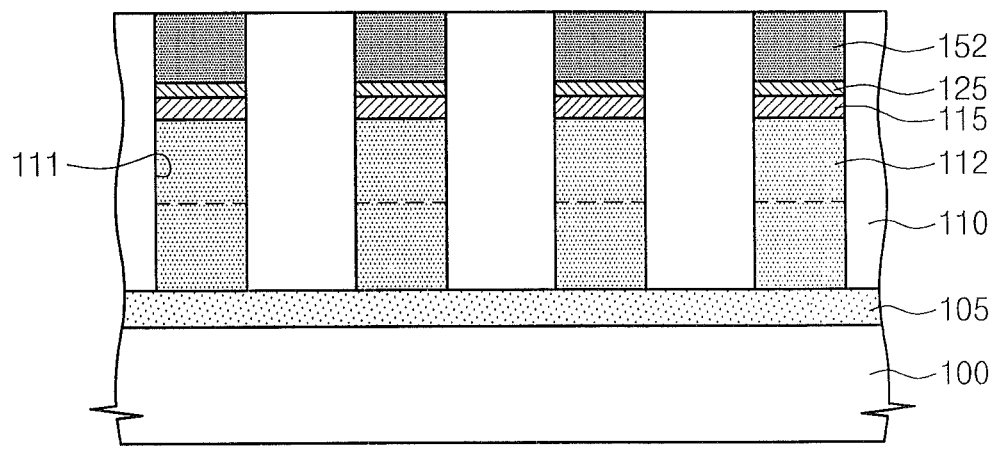
Figure 14B:
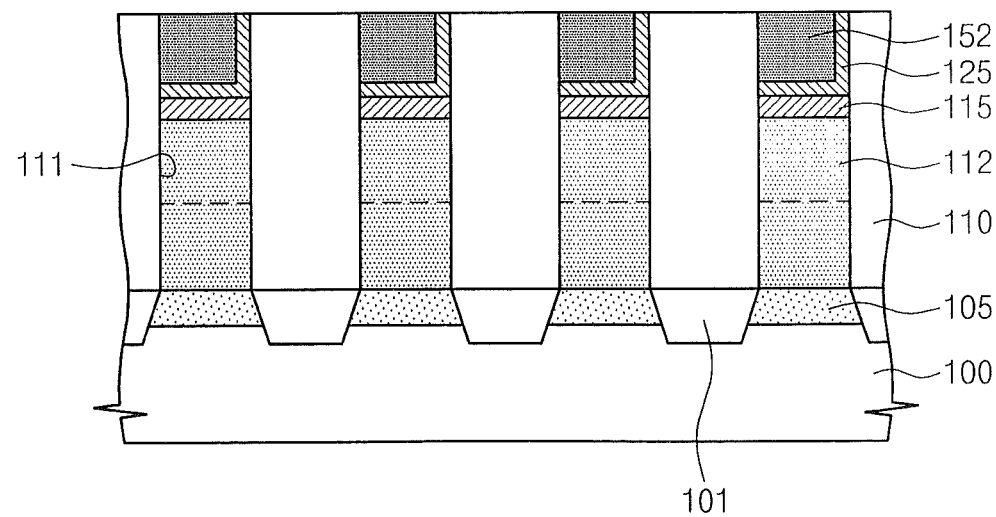

Referring to FIGS. 14A and 14B, lower electrodes 125 are formed in the openings 111 explained with reference to FIGS. 2A and 2B. The silicide layer 115 may be formed between the lower electrode 125 and the diode 112. The shape of the lower electrode 126 may have a half-ring type. For example, the lower electrode 125 may be formed by forming a mask layer which covers part of the lower electrode 124 of FIGS. 9A and 9B, removing part of the lower electrode 124 exposed by the mask layer, and filling the removed part with a fourth dielectric layer (not shown). Here, a dielectric pattern 152 filling each of the openings 111 may be provided on each of the lower electrodes 125.

Figure 15A:
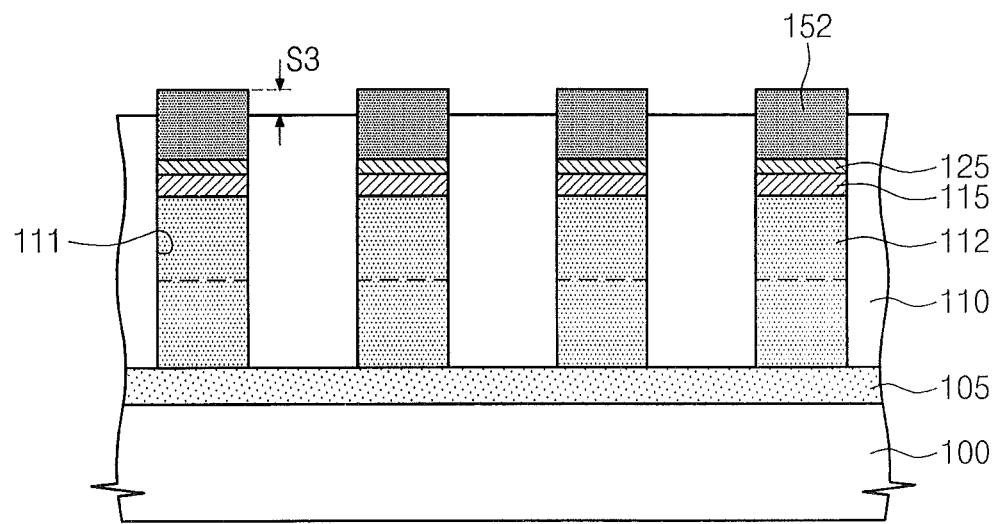
Figure 15B:
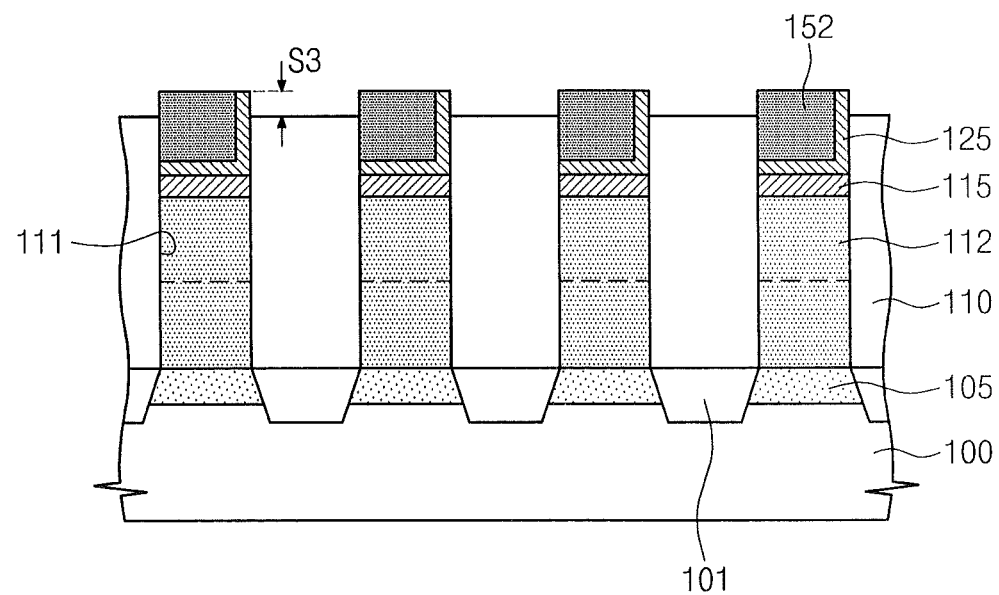

Referring to FIGS. 15A and 15B, an upper part of the first interlayer dielectric 110 may be recessed. The recess process may be dry or wet etching. A step S3 may be generated between the upper surface of the first interlayer dielectric 110 and an upper surface of the lower electrode 125, accordingly exposing an upper sidewall of the lower electrode 125.

Figure 16A:
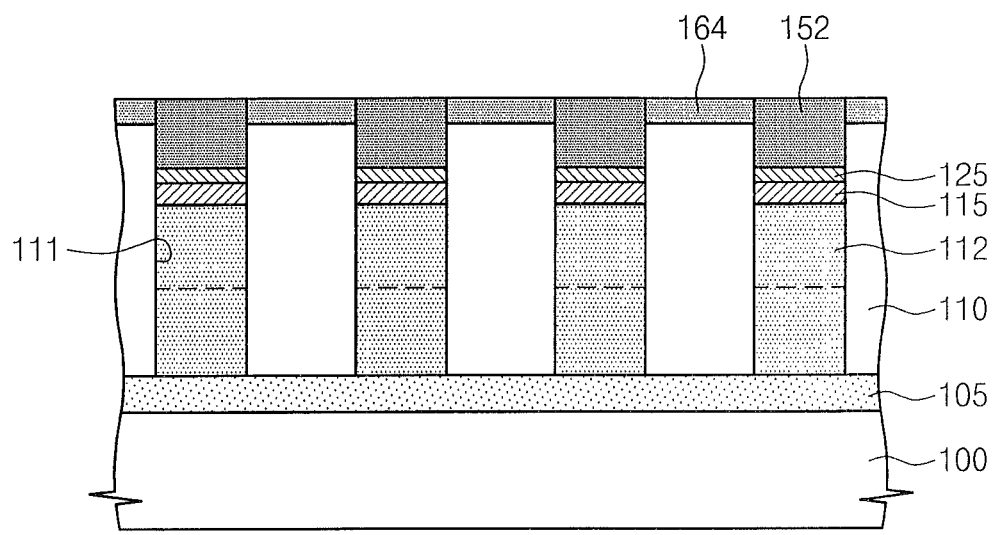
Figure 16B:
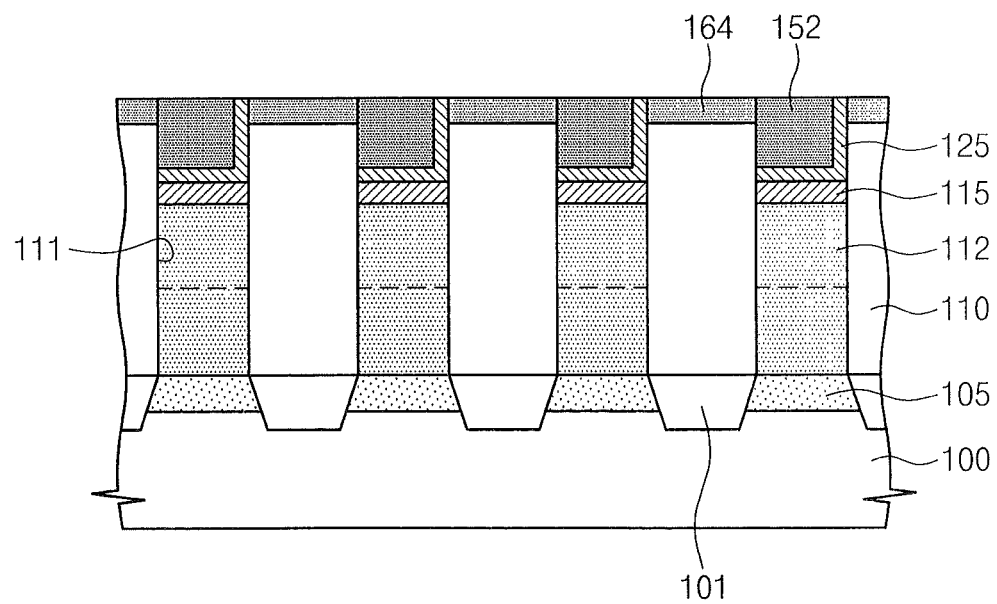

Referring to FIGS. 16A and 16B, an electrode passivation pattern 164 may be formed on the first interlayer dielectric 110. The electrode passivation pattern 164 may be formed by forming an electrode passivation layer (not shown) on the first interlayer dielectric 110 and the lower electrodes 125 and then planarizing the electrode passivation layer such that the upper surfaces of the lower electrodes 125 are exposed. The electrode passivation dielectric pattern 164 may be made of a material having an etch selectivity with respect to the second interlayer dielectric 130 that will be described hereinafter. For example, when the second interlayer dielectric 130 is a silicon oxide layer, the electrode passivation pattern 164 may be a silicon nitride layer.

Figure 17A:
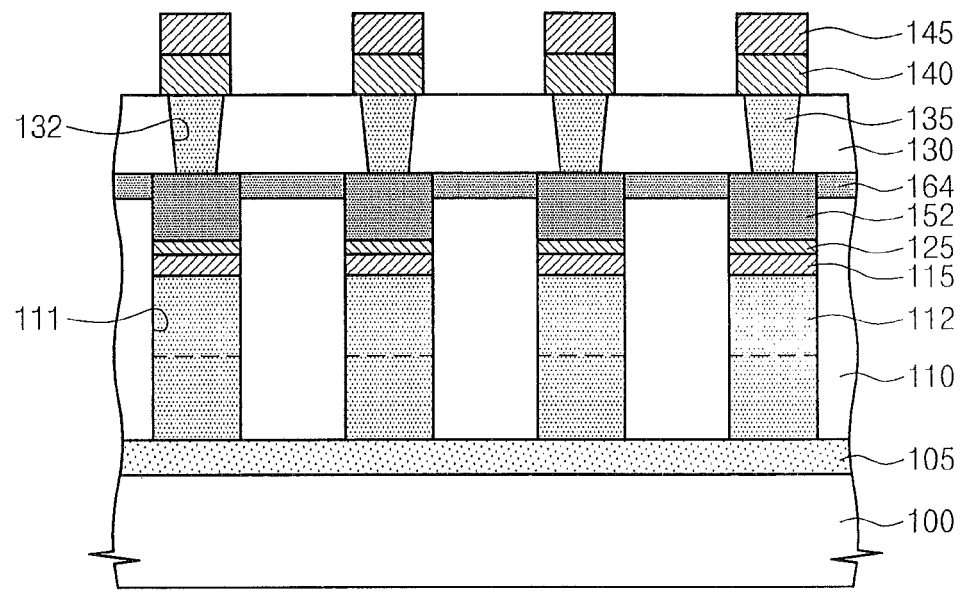
Figure 17B:
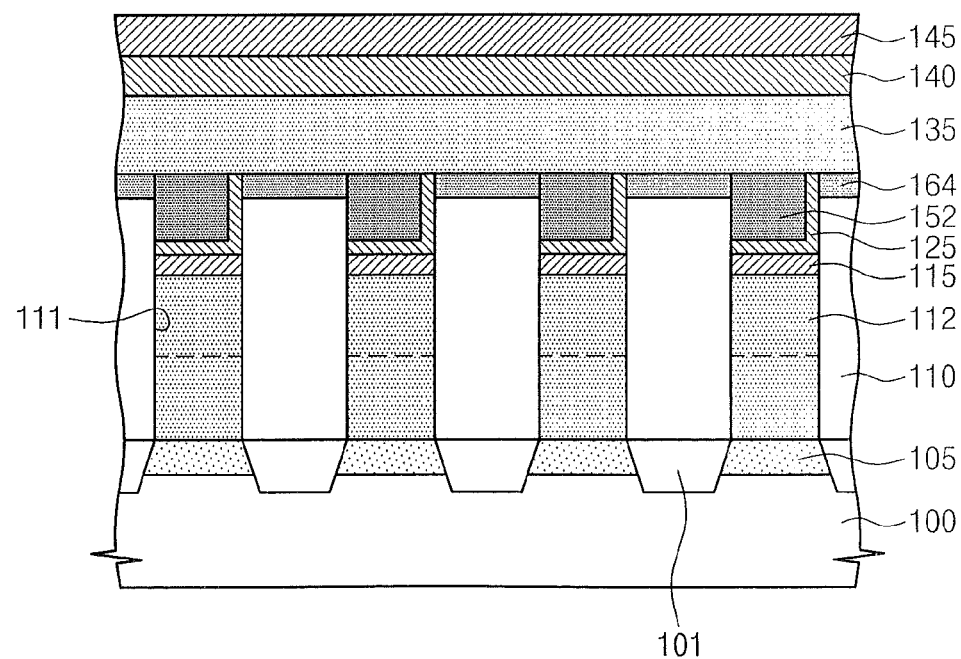

Referring to FIGS. 17A and 17B, the second interlayer dielectric 130 may be formed on the lower electrodes 125. In addition, the recess regions 132 exposing the upper surfaces of the lower electrodes 125 may be formed by patterning the second interlayer dielectric 130. The recess regions 132 may be trenches extending in the Y-Y' direction of FIG. 1. The patterning may be performed by dry or wet etching. The electrode passivation pattern 164 may prevent exposure of the upper sidewall of the lower electrode 125 during the patterning. The resistance variable material layer 135 may be formed in the recess region 132, extending in the Y-Y' direction of FIG. 1. For example, the resistance variable material layer 135 may be a phase change material layer. The electrode passivation pattern 164 may prevent contact between the upper sidewall of the lower electrode 125 and the resistance variable material layer 135, accordingly reducing the reset current.

The upper electrodes 140 and the bit lines 145 may be formed on the resistance variable material layers 135. The upper electrode 140 may be made of the same material as the lower electrode 125. The bit line 145 may be a metal thin layer. The bit line 145 may be formed by a sputtering process.

According to the third embodiment, since the contact area between the resistance variable material layer 135 and the lower electrode 125, the reset current may be reduced.

Figure 18:
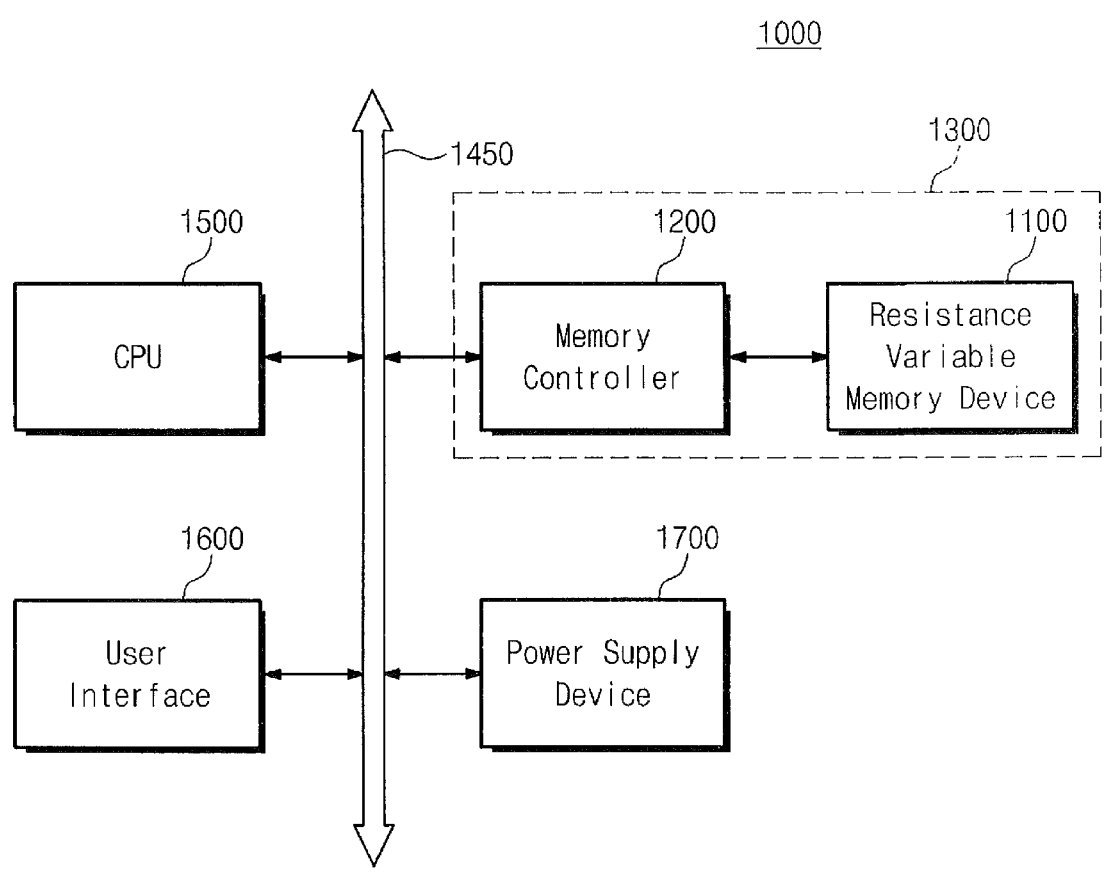
FIG. 18 is a block diagram of a memory system applying the resistance variable memory device according to the embodiments.

FIG. 18 is a block diagram of a memory system applying the resistance variable memory device according to the embodiments of the inventive concept.

Referring to FIG. 18, a memory system 1000 includes a semiconductor memory device 1300 consisting of a resistance variable memory device 1100 and a memory controller 1200, a central processing unit (CPU) 1500 electrically connected with a system bus 1450, a user interface 1600, and a power supply device 1700.

The resistance variable memory device 1100 stores data supplied through the user interface 1600 or processed by the CPU 1500, through the memory controller 1200. The resistance variable memory device 110 may include a semiconductor disc device or solid state drive (SSD) and in this case a writing speed of the memory system 1000 may be considerably improved.

Although not shown, it will be understood by those skilled in the art that the memory system 1000 according to the embodiments of the inventive concept may further include an application chipset, a camera image processor (CIS), a mobile dynamic random access memory (DRAM), and so forth.

Also, the memory system 1000 may be applied to a personal digital assistant (PDA), a portable computer, a web tablet, a wireless phone, a mobile phone, a digital music player, a memory card, or any other devices capable of wirelessly receiving and transmitting data.

Furthermore, the resistance variable memory device or memory system of the inventive concept may be mounted using various kinds of packages. The various kinds of the packages of the flash memory device or the memory system may include Package on Package (PoP), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

As described above, exposure of a sidewall of a lower electrode may be reduced and/or prevented during patterning of a second dielectric layer by providing an electrode passivation pattern having an etch selectivity with respect to the second dielectric layer on the lower electrode. Accordingly, a contact area between the lower electrode and a resistance variable material layer may be reduced and/or prevented from increasing.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A nonvolatile memory device, comprising:
a substrate;
a first insulating layer on the substrate and including a first opening therein;
a lower electrode in the first opening and protruding from a surface of the first insulating layer outside the first opening;
an electrode passivation pattern on a sidewall of the lower electrode that protrudes from the surface of the first insulating layer;
a second insulating layer on the first insulating layer and including a second opening therein at least partially exposing the lower electrode, wherein the electrode passivation pattern comprises a material having an etching selectivity to that of the second insulating layer; and
a variable resistance material layer extending into the second opening to contact the lower electrode, wherein the electrode passivation pattern electrically separates the sidewall of the lower electrode from the variable resistance material layer.

2. The device of claim 1, wherein the electrode passivation pattern comprises a sidewall spacer extending between the lower electrode and an inner sidewall of the first opening in the first insulating layer.

3. The device of claim 2, wherein the first insulating layer comprises a material that does not have an etching selectivity to that of the second insulating layer.

4. The device of claim 1, further comprising:
a word line on the substrate, wherein a portion of the word line is exposed by the first opening in the first insulating layer such that the lower electrode provides an electrical connection between the word line and the variable resistance material layer.

5. The device of claim 4, further comprising:
an upper electrode on the variable resistance material layer opposite the lower electrode; and
a bit line on the upper electrode,
wherein the upper electrode provides an electrical connection between the bit line and the variable resistance material layer.

6. The device of claim 4, further comprising:
a diode in the first opening in the first insulating layer and electrically contacting the word line; and
a silicide layer on the diode,
wherein the silicide layer is between the lower electrode and the diode.

7. The device of claim 1, wherein the lower electrode comprises:
a conductive layer on a sidewall of the first opening in the first insulating layer; and
a third insulating layer on the conductive layer,
wherein the third insulating layer comprises a material having an etching selectivity to that of the first insulating layer.

8. The device of claim 7, wherein the conductive layer extends on opposing sidewalls of the opening in the first insulating layer, and wherein the third insulating layer extends between the opposing sidewalls.

9. The device of claim 8, wherein the electrode passivation pattern comprises sidewall spacers extending on opposing sidewalls of the conductive layer that protrude outside the first opening in the first insulating layer.

10. The device of claim 7, wherein the electrode passivation pattern extends on the sidewall of the lower electrode and along the surface of the substrate outside the opening in the first insulating layer.

11. The device of claim 1, wherein the variable resistance material layer comprises a phase changeable material layer configured to transition between an amorphous state and a crystalline state responsive to heat applied thereto.

12. The device of claim 1, wherein the lower electrode is a ring type, a half ring type, or a linear type.

13. A nonvolatile memory device, comprising:
a substrate;
a word line on the substrate;
a first insulating layer on the substrate, the first insulating layer including a first opening therein at least partially exposing the word line;
a diode in the first opening in the first insulating layer and electrically contacting the word line; and
a silicide layer on the diode,
a lower electrode on the silicide layer in the first opening and protruding from a surface of the first insulating layer outside the first opening;
an electrode passivation pattern on a sidewall of the lower electrode that protrudes from the surface of the first insulating layer;
a second insulating layer on the first insulating layer, the second insulating layer including a second opening therein at least partially exposing the lower electrode, wherein the electrode passivation pattern comprises a material having an etching selectivity to that of the second insulating layer;
a variable resistance material layer extending into the second opening to contact the lower electrode, wherein the electrode passivation pattern electrically separates the sidewall of the lower electrode from the variable resistance material layer;
an upper electrode on the variable resistance material layer opposite the lower electrode; and
a bit line on the upper electrode.

14. A variable resistance memory device, comprising:
a first interlayer dielectric disposed on a substrate and comprising an opening therein;
a lower electrode in the opening;
a second interlayer dielectric on the first interlayer dielectric and comprising a recess region therein which exposes the lower electrode;
an electrode passivation pattern on a sidewall of the lower electrode and on an inner wall of the opening in the first interlayer dielectric; and
a variable resistance material layer in the recess region on the lower electrode,
wherein an upper surface of the lower electrode is disposed higher than an upper surface of the first interlayer dielectric exposed by the recess region.

15. The device of claim 14, wherein the electrode passivation pattern comprises a material having an etch selectivity with respect to the second interlayer dielectric.

16. The device of claim 15, wherein the electrode passivation pattern has an etch selectivity with respect to the first interlayer dielectric and the second interlayer dielectric.

17. The device of claim 14, wherein an upper surface of the electrode passivation pattern is coplanar with the upper surface of the lower electrode.

18. The device of claim 14, wherein the electrode passivation pattern is in the form of a spacer.

19. The device of claim 14, wherein the lower electrode is a ring type, a half ring type, or a linear type.

* * * * *